United States Patent
Do

(10) Patent No.: US 7,626,691 B2
(45) Date of Patent: Dec. 1, 2009

(54) APPARATUS AND METHOD FOR INSPECTING OVERLAY PATTERNS IN SEMICONDUCTOR DEVICE

(75) Inventor: Byung-Hun Do, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 502 days.

(21) Appl. No.: 11/524,293

(22) Filed: Sep. 21, 2006

(65) Prior Publication Data

US 2007/0133861 A1      Jun. 14, 2007

(30) Foreign Application Priority Data

Dec. 9, 2005    (KR) ...................... 10-2005-0120383

(51) Int. Cl.
  *G01N 21/00*   (2006.01)
  *G06K 9/00*    (2006.01)
(52) U.S. Cl. ................. 356/237.1; 356/237.5; 356/394; 382/149; 382/154
(58) Field of Classification Search ... 356/237.1–237.5, 356/394, 399–401; 382/145, 149, 154, 144, 382/151, 216; 430/30, 311
See application file for complete search history.

(56) References Cited

U.S. PATENT DOCUMENTS

| | | | | |
|---|---|---|---|---|
| 5,402,224 A | * | 3/1995 | Hirukawa et al. | ........... 356/124 |
| 5,754,299 A | * | 5/1998 | Sugaya et al. | ................ 356/401 |
| 6,522,776 B1 | * | 2/2003 | Ehrichs | ...................... 382/144 |
| 2001/0030744 A1 | * | 10/2001 | Chang | ..................... 356/237.3 |
| 2005/0031974 A1 | * | 2/2005 | Fukuhara | ..................... 430/30 |
| 2005/0053273 A1 | | 3/2005 | Ostrom et al. | |
| 2005/0117154 A1 | | 6/2005 | McArthur et al. | |

* cited by examiner

*Primary Examiner*—Sang Nguyen
(74) *Attorney, Agent, or Firm*—Volentine & Whitt, PLLC

(57) ABSTRACT

An apparatus for inspecting overlay patterns includes an optical module which projects a plurality of neighboring overlay patterns formed on a wafer. The apparatus also includes a pickup unit which obtains a plurality of image signals corresponding to the plurality of overlay patterns projected from the optical module. The apparatus also includes a comparison unit configured to generate a plurality of images including the plurality of overlay patterns from the image signals obtained at the pickup unit, compare an overlay pattern image corresponding to any one of the plurality of overlay patterns with a previously input overlay pattern image, and based on the comparison, extract at least a portion of the overlay pattern image identical or similar to the previously input overlay pattern image. The apparatus also includes a restoration unit which restores the partially extracted overlay pattern image in accordance with a predetermined overlay pattern. The apparatus also includes a readout unit which calculates and compares a position of the restored overlay pattern image with a position of an overlay pattern image not compared by the comparison unit, and which reads out a deviation between the two positions.

13 Claims, 6 Drawing Sheets

APPARATUS AND METHOD FOR INSPECTING OVERLAY PATTERNS IN SEMICONDUCTOR DEVICE

BACKGROUND OF THE INVENTION

1. Technical Field

The present invention relates generally to semiconductor manufacturing equipment and, more particularly, to an apparatus and method for inspecting overlay patterns in a semiconductor device.

A claim of priority is made to Korean Patent Application No. 10-2005-0120383, filed Dec. 9, 2005, in the Korean Intellectual Property Office, the disclosure of which is hereby incorporated herein by reference in its entirety.

2. Discussion of Related Art

To meet the increasing demand for semiconductor components having high operating speeds and small sizes, manufacturers have made improvements to the semiconductor manufacturing processes. The improvements in the semiconductor manufacturing processes have lead to increasing production yields from these processes.

While production yields of semiconductor components have improved, there is also a need for methods and equipment that may be used to inspect for manufacturing defects during the various semiconductor fabrication processes. The manufacturing defects may occur due to various reasons. For example, process conditions are frequently varied in a photolithographic process (one of the main semiconductor manufacturing process). These variations in process conditions may lead to manufacturing defects in the semiconductor components. It is therefore desirable to develop an inspection process for detecting manufacturing defects and an apparatus for performing the inspection process.

As mentioned above, the photolithographic process is an important semiconductor manufacturing process. The photolithographic process refers to a process of applying a photo-resist on a wafer and exposing and developing the photo-resist to form a photo-resist pattern. Then, either the wafer under the photo-resist pattern or a thin layer formed on the wafer is patterned using the photo-resist pattern as an etch mask.

An attempt may be made to form a precise semiconductor pattern on the wafer through the photolithographic process. At this time, in order to enable the photo-resist pattern to be formed in a desired shape, a "reticle" may be used as a pattern mask for selectively sensitizing the photo-resist. In order to produce a precise pattern, the reticle should be positioned at a designated position and the wafer corresponding to the reticle should also be aligned properly. However, the reticle and the wafer may not be aligned properly. This misalignment may be due to various reasons such as, for example, a malfunction in the optical system that propagates incident light projected onto the reticle. This misalignment of the reticle and/or the wafer may cause various problems such as, for example, an imprecise semiconductor pattern. Furthermore, the problem may be exacerbated during the formation of subsequent patterns on the wafer. For example, other thin layer patterns that are formed in subsequent processes may now not be formed at their designated positions. These defects formed on a semiconductor device during the semiconductor manufacturing process may affect the functionality of the semiconductor device.

In order to overcome this problem, almost all reticles used in the exposure process may be formed with alignment patterns and overlay patterns. Alignment and overlay patterns may be used for proper alignment of the wafer. Specifically, the alignment pattern is used to align the wafer so that the exposure during the photolithographic process is performed only on those portions of the wafer that require the exposure. The overlay pattern is used for inspecting whether the patterns formed in the photolithographic process in the precedent and subsequent processes are consistent with each other. In particular, the overlay patterns may be made to overlap each other or may be arranged at a constant interval in such a manner that the overlay patterns formed in the precedent process can be compared with those formed in the subsequent process whenever the reticles are changed.

An apparatus may be used to inspect the overlay patterns and determine differences between the overlay patterns formed in different processes. The determined differences may be presented to an operator or a controller of the semiconductor manufacturing equipment. Based on the information received, the controller or operator may adjust the manufacturing equipment so that a photo-resist pattern is formed at a desired position.

At this time, the plurality of overlay patterns that are measured by the overlay pattern inspecting apparatus are formed one at a time, i.e., each overlay pattern is formed whenever one layer is formed on the wafer. Therefore, like the layers formed on the wafer, the overlay patterns are stacked over each other and consequently, are not located on the same plane.

The conventional overlay pattern inspecting apparatus is configured to magnify and project a plurality of neighboring overlay patterns through an optical module. Furthermore the apparatus shoots the magnified and projected overlay patterns at a pickup unit such as a camera, and obtains image signals corresponding to the plurality of overlay patterns. Furthermore, a readout unit in the apparatus converts the image signals obtained at the pickup unit into images, reads out a positional difference between the plurality of overlay pattern images corresponding to the plurality of overlay patterns, calculates a correction value for the overlay patterns, and feeds the result to an exposure apparatus.

Specifically, in a conventional overlay pattern inspecting apparatus, the optical module irradiates incident light made up of white visible light onto a wafer, magnifies and projects the reflected light, and enables the pickup unit to obtain images of the plurality of overlay patterns. Furthermore, the plurality of overlay patterns may be formed as recessed trenches or protruding blocks having a predetermined step height corresponding to the layer formed on the wafer.

While the conventional overlay pattern inspecting apparatus may be used to inspect overlay patterns, it has several shortcomings. For example, foreign materials such as slurry may be adhered in the trench or around the block. These foreign materials may be introduced by one or more manufacturing processes such as, for example, a proceeding planarization process, such as CMP (Chemical Mechanical Planarization.) This formation of foreign materials may distort a line width of the overlay patterns. Therefore, the visible light may be diffracted or scattered in a part of the overlay pattern which has a line width having a magnitude similar to a wavelength of the visible light. The scattering or diffraction of the visible light may cause incorrect overlay pattern inspection. For example, light made up of white visible light may be incident on the plurality of overlay patterns and may be subject to diffraction or scattering. This diffraction or scattering may cause the light to be reflected back with at least one of red, blue, and green colors.

In a conventional inspection apparatus, the pickup unit processes the reflected light which is diffracted or scattered by the overlay patterns into an image signal without change, thus distorting overlay pattern images in whole or in part.

Furthermore, the pickup unit transmits these distorted images to the readout unit. As such, the readout unit may incorrectly calculate the correction value for the overlay patterns on the basis of the plurality of overlay pattern images that are distorted in whole or in part. This incorrect calculation may lead to faulty fabrication of the semiconductor devices, thus resulting in the decrease of a production yield of semiconductor devices.

In addition, the overlay patterns are generally formed on the wafer so as to be symmetrical about their center in the vertical and horizontal directions. However, when some of the overlay patterns are damaged or asymmetrical, the readout unit may fail to correctly calculate the correction value for the overlay patterns on the basis of the image signals of the overlay patterns that are picked up at the pickup unit. This type of incorrect calculation of the correction value may also result in the decrease of a production yield of semiconductor devices.

The present disclosure is directed to overcoming one or more of the problems associated with the prior art overlay pattern inspecting apparatus.

SUMMARY OF THE INVENTION

One aspect of the present disclosure includes an apparatus for inspecting overlay patterns. The apparatus includes an optical module which projects a plurality of neighboring overlay patterns formed on a wafer. The apparatus also includes a pickup unit which obtains a plurality of image signals corresponding to the plurality of overlay patterns projected from the optical module. The apparatus also includes a comparison unit configured to generate a plurality of images including the plurality of overlay patterns from the image signals obtained at the pickup unit, compare an overlay pattern image corresponding to any one of the plurality of overlay patterns with a previously input overlay pattern image, and based on the comparison, extract at least a portion of the overlay pattern image identical or similar to the previously input overlay pattern image. The apparatus also includes a restoration unit which restores the partially extracted overlay pattern image in accordance with a predetermined overlay pattern. The apparatus also includes a readout unit which calculates and compares a position of the restored overlay pattern image with a position of an overlay pattern image not compared by the comparison unit, and which reads out a deviation between the two positions.

Another aspect of the present disclosure includes a method for inspecting overlay patterns. The method comprises of projecting a plurality of neighboring overlay patterns formed on a wafer. The method also comprises of picking up the plurality of projected overlay patterns and obtaining image signals corresponding to the plurality of projected overlay patterns. The method also comprises of generating images including the plurality of overlay patterns using the obtained image signals. The method also comprises of comparing an overlay pattern image corresponding to any one of the plurality of overlay patterns with a previously input overlay pattern image. The method also comprises of extracting, based on the comparison, at least a portion of the overlay pattern image identical or similar to the previously input overlay pattern image. The method also comprises of restoring the extracted overlay pattern image in accordance with a predetermined overlay pattern. The method also comprises of calculating and comparing a position of the restored overlay pattern image with a position of an overlay pattern image not compared by the comparison unit, and reading out a deviation between the two positions.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1:
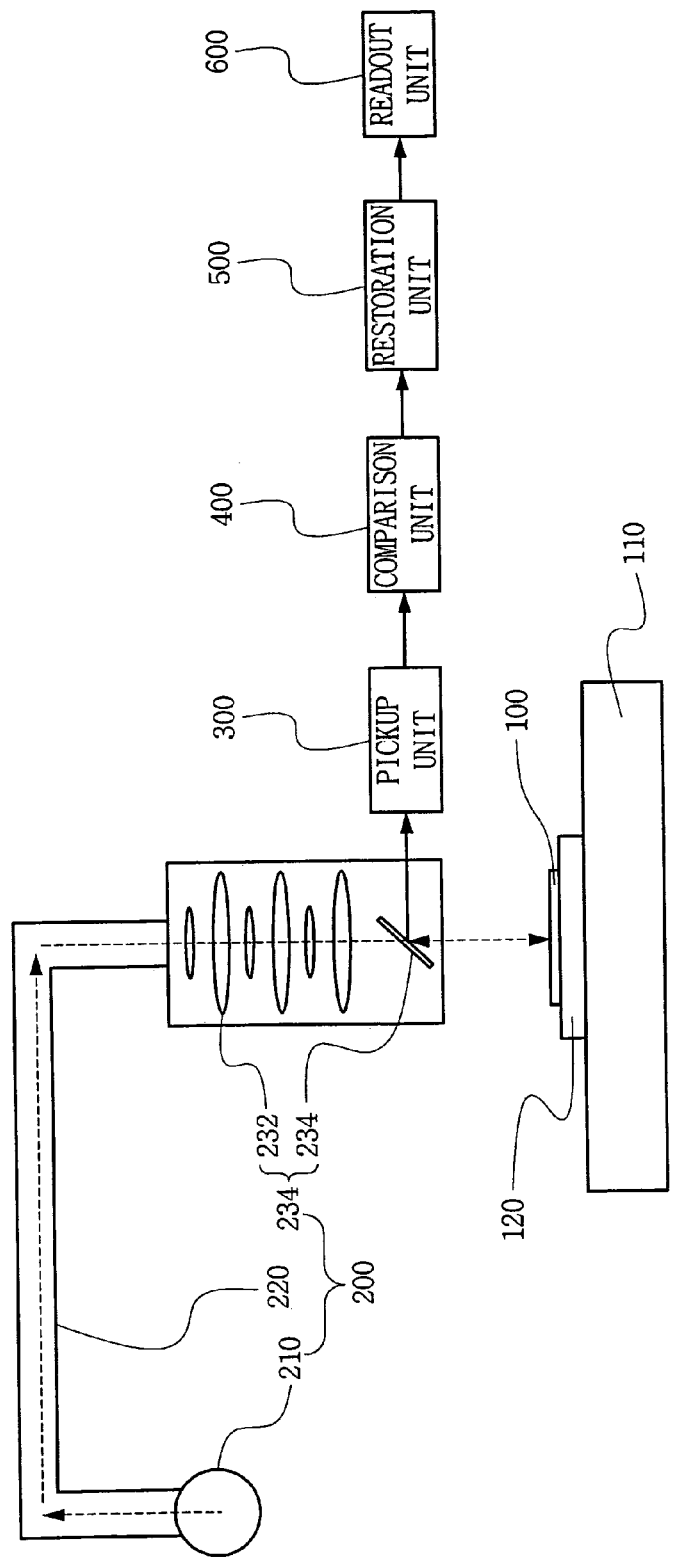
FIG. 1 is a schematic diagram illustrating an overlay pattern inspecting apparatus according to an exemplary disclosed embodiment.

The present invention will now be described with reference to the accompanying drawings, in which preferred embodiments of the invention are shown. However, the invention should not be construed as limited to only the embodiments set forth herein. Rather, these embodiments are presented as teaching examples. In the drawings, like numbers refer to like elements.

Figure 2:
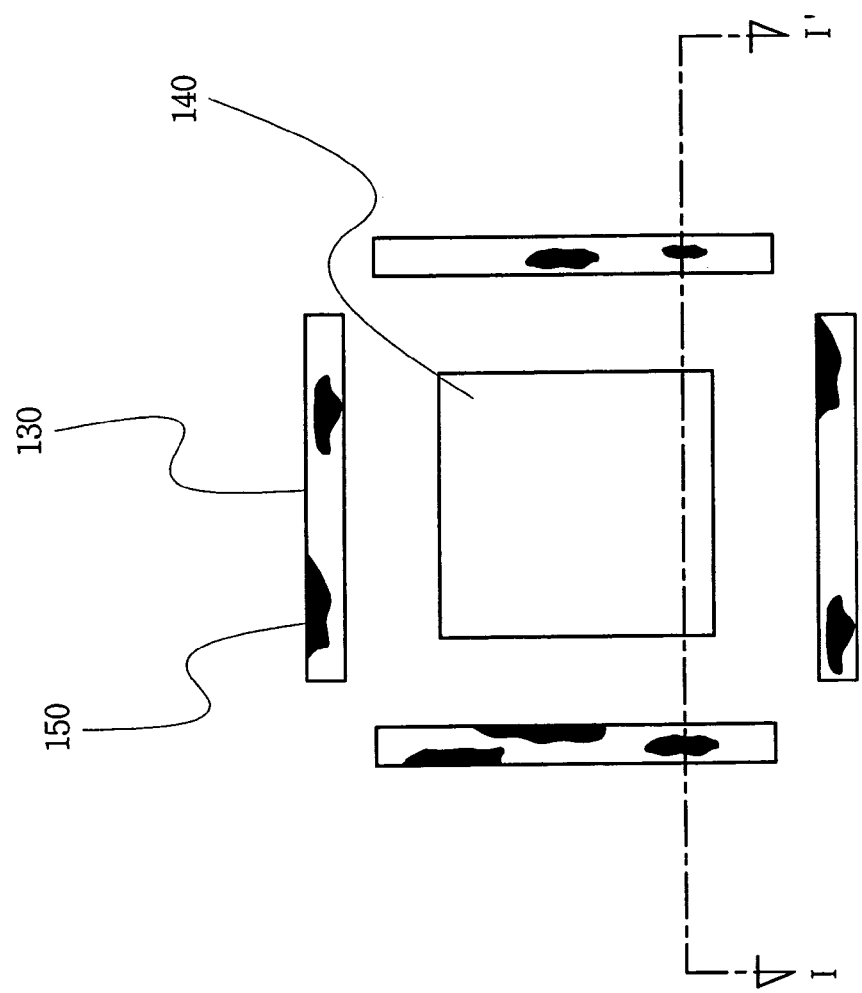
FIG. 2 is the top view of an overlay pattern according to an exemplary disclosed embodiment.
Figure 3:
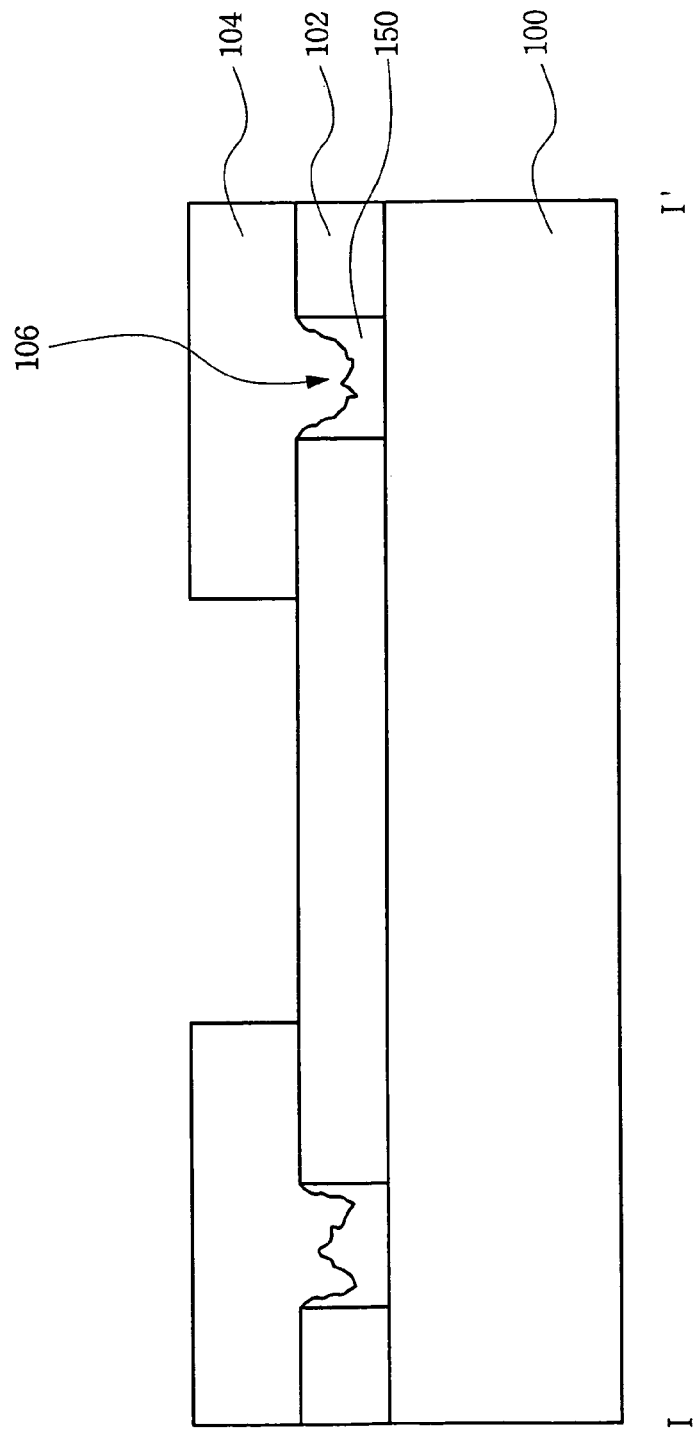
FIG. 3 is a cross-sectional view taken along lines I-I' of FIG. 2.
Figure 4A:
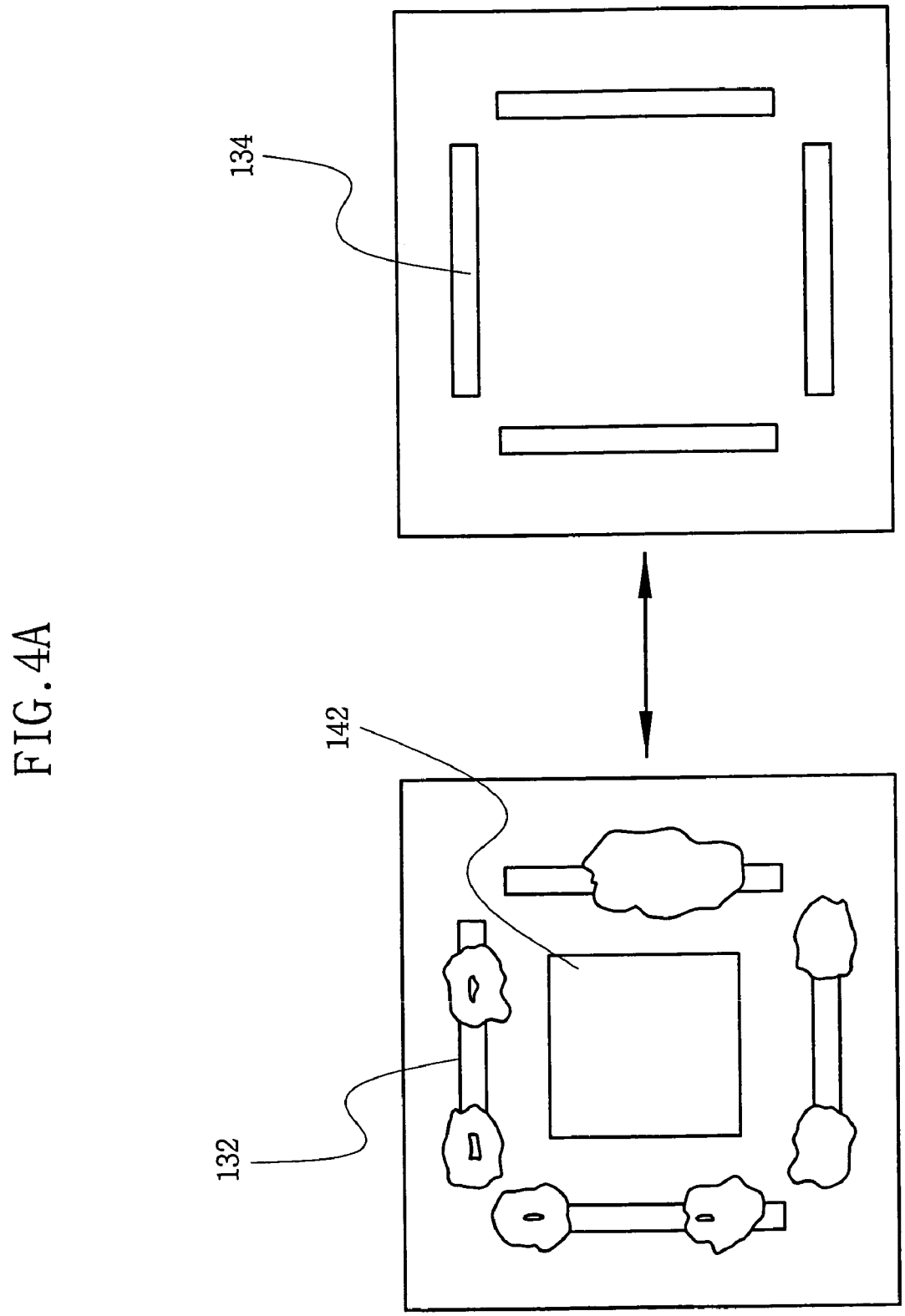
FIGS. 4a to 4c show step-by-step restoration of an overlay pattern image using the overlay pattern inspecting apparatus of FIG. 1.
Figure 4B:
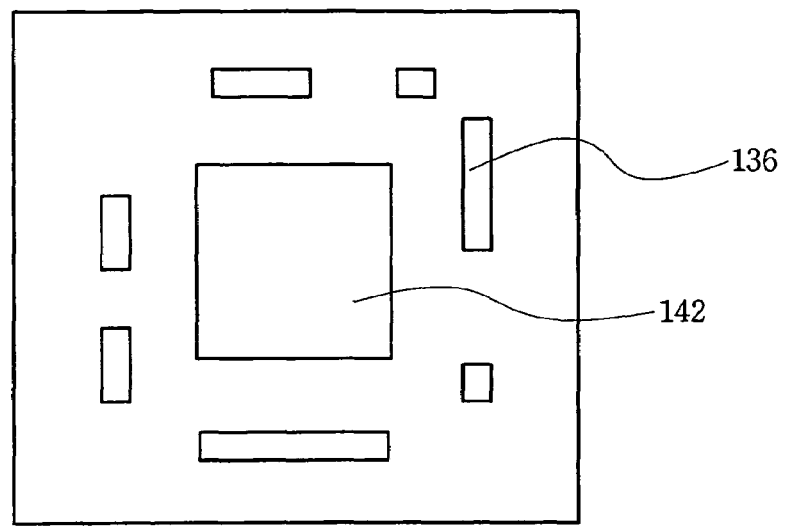
Figure 4C:
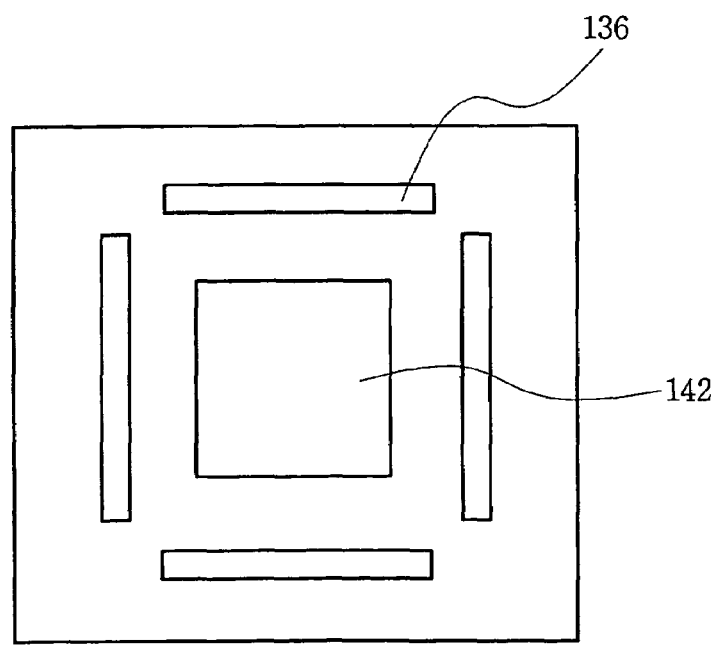

FIG. 1 is a schematic diagram illustrating an overlay pattern inspecting apparatus according to an exemplary embodiment of the present invention. FIG. 2 is the top view of an exemplary overlay pattern. FIG. 3 is a cross-sectional view taken along lines I-I' of FIG. 2. FIGS. 4a to 4c show step-by-step restoration of an overlay pattern image using the overlay pattern inspecting apparatus of FIG. 1.

As shown in FIGS. 1 to 4c, in an exemplary embodiment, an apparatus for inspecting overlay patterns is composed of an optical module 200, a pickup unit 300, a comparison unit 400, a restoration unit 500, and a readout unit 600. The optical module 200 projects a plurality of neighboring overlay patterns (e.g. main scale 130 and vernier 140) formed on a wafer 100. The pickup unit 300 obtains image signals corresponding to the plurality of overlay patterns projected from the optical module 200. The comparison unit 400 generates images including the plurality of overlay patterns from the image signals obtained at the pickup unit 300. Furthermore, the comparison unit 400 compares an overlay pattern image (e.g. first main scale image 132) with any one of the plurality of overlay pattern images (e.g. second main scale image 134) input from a database (not shown), and extracts the portion of the overlay pattern image that is identical between the two images or has the most similarity between the two images. The restoration unit 500 restores the overlay pattern image extracted by the comparison unit 400 so that the restored image corresponds to any one of the plurality of overlay patterns formed on a reticle. The readout unit 600 calculates a position of the overlay pattern image restored by the restoration unit 500 and compares the calculated position with a position of the overlay pattern image (e.g. vernier image 142) that is not compared by the comparison unit 400, and outputs the difference between the positions of the overlay pattern images. The output from the readout unit 600 may be in the form of a correction value that is transmitted to the exposure apparatus used in a photolithography process. The exposure apparatus may use the correction value to form a photo-resist pattern accurately in subsequent photolithography processes.

While not shown, the overlay pattern inspecting apparatus may also include a display unit for displaying the overlay pattern image that is picked up by the pickup unit 300, compared by the comparison unit 400, and restored by the restoration unit 500. The display unit may also display the overlay pattern image that is not compared by the comparison unit 400 so as to enable an operator to look at both the overlay pattern images.

In an exemplary embodiment, the optical module 200 includes a light source 210, a light guide unit 220, and a projection unit 230. The light source 210 generates incident light that is made up of white visible light and is incident onto a surface of the wafer 100. The light guide unit 220 propagates the incident light generated by the light source 210 in a direction perpendicular to the surface of the wafer 100. Wafer 100 is supported by a chuck 120 on a stage 110. The projection unit 230 casts the incident light propagated by the light guide unit 220 onto the surface of the wafer 100. The projection unit 230 also extracts light reflected from the surface of the wafer 100 and projects the reflected light onto the pickup unit 300.

The light source 210 may include a lamp capable of generating a predetermined intensity of visible light. Furthermore, the light guide unit 220 may include an optical fiber or reflecting mirror capable of minimizing loss of the visible light generated from the lamp. In addition, the projection unit 230 may include at least one lens 232 for diverging or converging the visible light propagated by the light guide unit and casting the light onto the plurality of overlay patterns formed on the surface of the wafer 100. Furthermore, the projection unit 230 may also include a beam splitter 234 for passing the incident light cast onto the plurality of overlay patterns and splitting and reflecting the reflected light.

Image signals in the form of light reflected from the wafer 100 are supplied from the optical module 200 to the pickup unit 300. In an exemplary embodiment, the pickup unit 300 may include a charge coupled device (CCD) image sensor or a complementary metal oxide semiconductor (CMOS) image sensor. CCD is a semiconductor device invented in 1970 at Bell Labs. In an exemplary embodiment, the image sensor may be used as a shift register or a memory device. A CMOS image sensor has a slow operating speed but has low power consumption because of the use of p and n channel transistors in an inverter circuit included in the CMOS image sensor.

The comparison unit 400 converts the image signals output from the pickup unit 300 into overlay pattern images of the plurality of overlay patterns. Furthermore, the comparison unit 400 receives an overlay pattern image corresponding to any one of the plurality of overlay patterns that are pre-stored in a database. The comparison unit 400 compares an overlay pattern image converted from the image signal of the pickup unit 300 with one of the plurality of overlay pattern images received from the database. Furthermore, the comparison unit 400 selects and extracts at least a portion of an image where the overlay pattern images are similar or identical to each other.

As shown in FIG. 2, the plurality of overlay patterns may include the main scale 130 formed on the wafer 100 by a precedent process and the vernier 140 formed in the main scale 130 or within a contour enclosed by the main scale 130 by a subsequent process. For example, the main scale 130 may be formed by a unit process in the form of numerous bars enclosing a square contour with a predetermined height from the surface of the wafer 100. Furthermore, the vernier 140 may be formed in the main scale 130 by a subsequent unit process in the shape of a square, one side of which is shorter in length than the main scale 130.

Referring to FIG. 3, the unit process used to form the overlay patterns includes a number of sub-processes. These sub-processes may include a photolithographic process, an etching process, an ashing process, and a chemical mechanical polishing process. The photolithographic process is used to form a photo-resist pattern on either the wafer 100 or a thin layer 102 formed on the wafer 100. The etching process removes either the surface of the wafer 100 or the thin layer 102 formed on the wafer 100 which is exposed through the photo-resist pattern, to form a trench 106 or block. The ashing process removes the photo-resist pattern formed on either the wafer 100 or the thin layer 102. The chemical mechanical polishing process planarizes either the wafer 100 or the thin layer 102 formed on the wafer 100.

As shown in FIG. 3, the main scale 130 is formed with bar-shaped trenches or blocks having a predetermined line width at the thin layer 102. Thin layer 102 may be either an interlayer insulating layer such as a silicon oxide layer or a conductive layer such as a polysilicon layer doped with conductive impurities.

In order to planarize the surface of the multilayered wafer 100 or the thin layer 102 by means of the chemical mechanical polishing process, a part of slurry 150 may be introduced and adhered to a portion of the trench 106 or around the block. Furthermore, a predetermined thickness of photo-resist 104 may be formed on the surface of the wafer 100. Another unit process may form the main scale 130 on the surface of the wafer 100. Furthermore, the vernier 140 that is made up of the photo-resist 104 and patterned in a square shape, may be formed in the main scale 130 during a subsequent unit process.

Although the main scale 130 is formed with the bar shaped trenches 106 having a line width greater than a wavelength of visible light, the introduction of slurry 150 to each trench 106 may reduce the line width of the bar shaped trenches. This reduction in line width may cause the line width of the bar-shaped trenches 106 to be closer to the wavelength of visible light incident on the wafer 100. Because of the similarity between the line width of the bar-shaped trenches 106 and the wavelength of visible light, the visible light may be diffracted or scattered at each trench 106, leading to the distortion of an image of the main scale 130.

As shown in FIG. 4a, when the image signals of the main scale 130 and vernier 140 are received through the pickup unit 300, the comparison unit 400 may compare a first main scale image 132 represented by the image signal obtained at the pickup unit 300 with a second main scale image 134 pre-stored in the database. In an exemplary embodiment, the second main scale image 134 may include a photo-resist pattern image (not shown) of the main scale 130 which is formed on the thin layer 102. Alternatively, the second main scale image 134 may include the image of a main scale pattern (not shown) formed on the reticle of an exposure apparatus. The comparison unit 400 may compare the first and second main scale images 132 and 134 by overlapping the first and second main scale images 132 and 134. Alternatively, the comparison may be made by comparing corresponding portions of the main scale images 132 and 134 by placing the main scale images 132 and 134 separate from each other.

Thus, the comparison unit 400 can compare the overlay pattern image that is partly distorted in line width by the diffraction or scattering of the visible light due to the slurry 150 with the overlay pattern image that has a fixed line width and is pre-stored in the database. Furthermore, the comparison unit 400 can also compare the overlay pattern image pre-stored in the database with the overlay pattern image picked up by the pickup unit 300 when the overlay pattern from the pickup unit 300 is damaged or asymmetrical.

The comparison unit 400 also performs an extraction function. Referring to FIG. 4b, after comparing the first main scale image 132 with the second main scale image 134, the comparison unit 400 selects and extracts the portion of the first main scale image 132 whose line width matches that of the second main scale image 134. The image extracted from the first main scale image 132 is a third main scale image 136. Because the comparison unit 400 also performs the function of extracting the portion of the first main scale image 132 whose line width matches that of the second main scale image 134, the comparison unit 400 may also be known as an extraction unit.

For example, when the first main scale image 132 has an irregular line width, the comparison unit 400 removes the part of the first main scale image 132 that is unequal to the line width of the second main scale image 134. This removal may occur by overlapping the fixed line width of second main scale image 134 with the first main scale image 132 and partly selecting and extracting the first main scale image 132 having the line width equal or similar to that of the second main scale image 134.

Referring to FIG. 4c, the restoration unit 500 is used to restore the third main scale image 136 to a fourth main scale image 138. Specifically, the fourth main scale image 138 may correspond to the main scale pattern formed on the reticle of the exposure apparatus. Furthermore, as shown in FIG. 4c, the fourth main scale image 138 may also have the shape of numerous bars enclosing the square contour. In addition, the restoration unit 500 may also restore the first main scale image 132 as the fourth main scale image 138 by placing the second main scale image 134 at the position of the first main scale image 132.

The readout unit 600 is used to calculate a correction value for the overlay patterns. At this time, it should be noted that the overlay pattern image of the vernier 140 is the vernier image 142. The correction value calculated by the readout unit 600 may be based on a deviation between a central position of the restored first main scale image 132 (i.e., fourth main scale image 138) or a central position of the second main scale image 134, and a central position of the vernier image 142. Specifically, the readout unit 600 measures deviation from a central position of the first main scale image 132 restored by the restoration unit 500, or a central position of the second main scale image 134 fixed at the position of the first main scale image 132 in the restoration unit 500, and a central position of the image of the vernier 400. Based on the measured deviation, the readout unit 600 calculates a correction value for the overlay patterns.

In an exemplary embodiment, the readout unit 600 determines a central position of the restored first main scale image 132 and a central position of the vernier image 142 based on the rectangular coordinate plane. Specifically, the readout unit 600 divides the restored first main scale image 132 or the second main scale image 134 fixed at the position of the first main scale image 132 into X and Y axial directions. Furthermore, the readout unit 600 calculates a central position between numerous bars perpendicular to the X axial direction and a central position between numerous bars perpendicular to the Y axial direction. After determining the two central positions, the readout unit 600 draws the central position of the restored first main scale image 132 in X and Y axial directions. Similarly, the readout unit 600 divides both sides of the square vernier 140 into the X and Y axial directions, finds a central position of each side, and draws the central position of the vernier 140. Furthermore, the readout unit 600 compares the central position of the restored first main scale image 132 with the central position of the vernier 140 and calculates the correction value for the overlay patterns. The correction value refers to how much the vernier 140 is deviated from the main scale 130 in the X or Y axial direction. For example, when the central position of the first main scale image 132 matches that of the vernier 140, the correction value will be calculated as zero (0) in the readout unit 600.

While the exemplary embodiment describes a method of determining the correction value based on central positions in the X and Y axial directions, one skilled in the art will appreciate that other methods of determining the deviation between the restored first main scale image 132 and the vernier image 142 may also be used. For example, the correction value may be calculated by determining positional differences between the numerous main scales 130 formed on the wafer 100 and the numerous verniers 140 formed neighboring the main scales 130, and averaging out the various positional differences.

Figure 5:
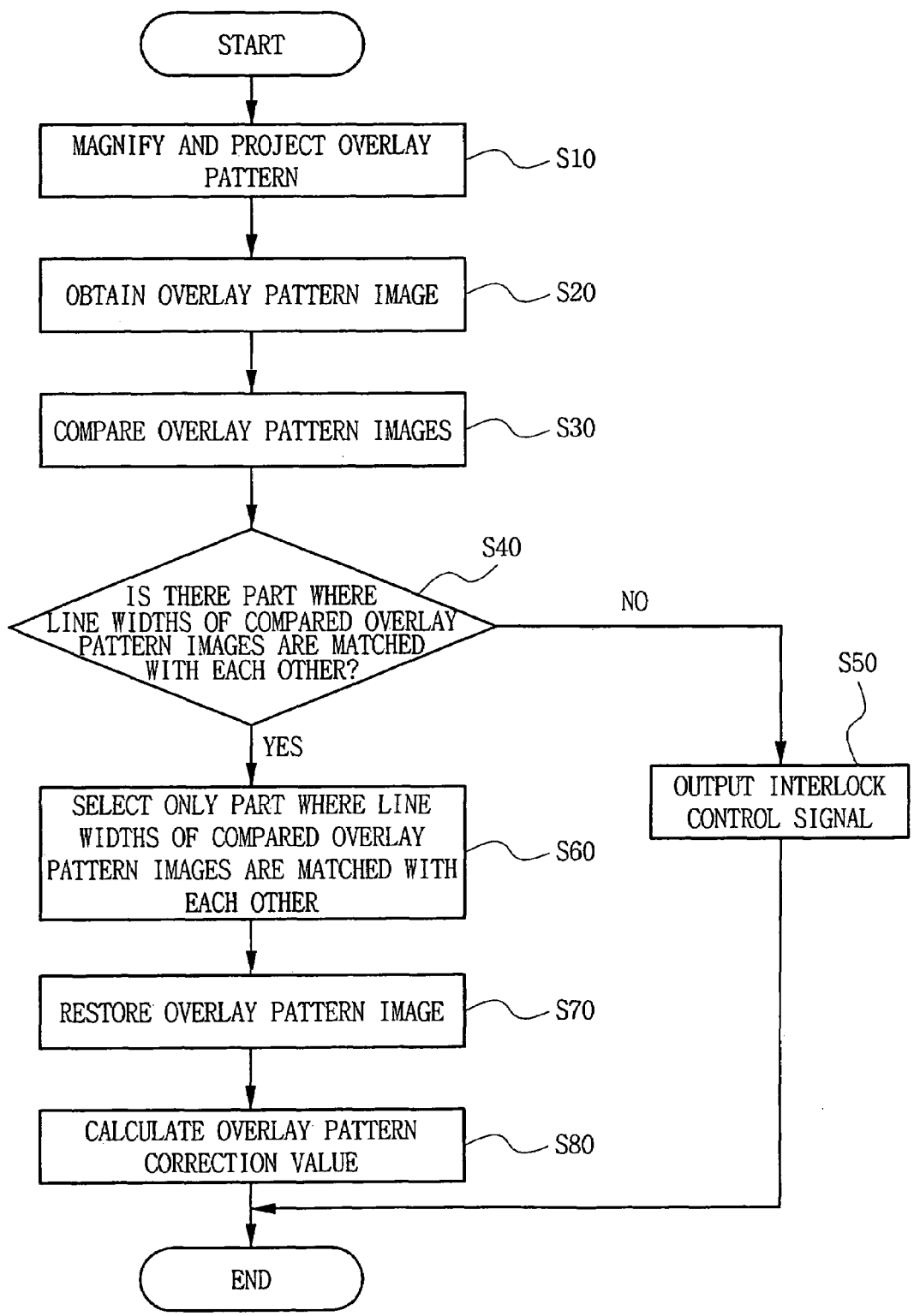
FIG. 5 is a flowchart showing an overlay pattern inspecting method according to an exemplary disclosed embodiment.

FIG. 5 is a flowchart illustrating an overlay pattern inspecting method according to an exemplary embodiment of the present invention.

Referring to FIG. 5, at step 10, when a flat zone or notch formed at the wafer 100 is aligned on the chuck 120, an overlay pattern inspection apparatus uses the optical module 200 to magnify and project an overlay pattern formed at a set distance from the central position of the wafer 100. In particular, the lens 232 of the optical module 200 magnifies and projects the overlay pattern at the central position of the wafer 100.

The magnification and projection of the overlay pattern involves a number of steps. First, the lens 232 of the optical module 200 shifts a focus to the central position (shot center) of the chip and magnifies a part or whole of the chip. The lens 232 of the optical module 200 can magnify and project a chip pattern at a magnification of about 12 mm in size. Next, the lens 232 of the optical module 200 shifts the focus from the central position of the chip to a first alignment mark formed at an eye point on the edge of the chip and magnifies and projects the first alignment mark. The lens 232 of the optical module 200 magnifies and projects the first alignment mark at a magnification of about 750 μm in size. In addition, the first alignment mark is formed at each corner of the chip in an "L" shape. The eye point corresponding to the first alignment mark is a position of the alignment mark that can generally obtain the best image in the pattern of the chip, and can be marked or selected arbitrarily by an operator. Then, the lens 232 of the optical module 200 shifts the focus to a second alignment mark formed at the eye point (shot reference point) adjacent to the first alignment mark. For example, the second alignment mark is formed so as to have a crisscross shape around the first alignment mark formed at the corner of the chip. At this time, the lens 232 of the optical module 200 magnifies and projects the first and second alignment marks at an equal or similar magnification. Finally, the lens 232 of the optical module 200 shifts the focus to the overlay pattern formed at a fixed distance from the second alignment mark, and magnifies and projects the overlay pattern. For example, the lens 232 of the optical module 200 magnifies and projects the first alignment mark at a magnification of about 50 μm in size. At this time, the optical module 200 casts incident light onto the wafer 100 formed with the overlay pattern, and projects light reflected from the wafer 100 to the pickup unit 300.

The pickup unit 300 picks up the light reflected from the wafer 100 including the overlay patterns. In particular, the pickup unit 300 picks up the light reflected from each overlay pattern at a predetermined resolution and obtains an overlay pattern image for each overlay pattern. For example, the pickup unit 300 obtains the plurality of overlay pattern images having a resolution of about 3 million pixels or more.

At step 20, the comparison unit 400 converts each image signal picked up and output by the pickup unit 300 into the corresponding first overlay pattern image 132. At step 30, the comparison unit 400 receives a second main scale image 134 corresponding to a first main scale image 132 from among the overlay pattern images pre-stored in a database and compares the first main scale image 132 with the second main scale image 134.

The comparison between the first and second main scale images 132 and 134 may be made using different comparison methods. In one comparison method, the first and second main scale images 132 and 134 are made to overlap with each other, and then their line widths are compared with each other. In another method, the first and second main scale images 132 and 134 are laid separate from each other and corresponding parts of the images are compared to each other on a one-to-one basis. At this time, when the first and second main scale images 132 and 134 are compared after the two images overlap each other, the line width of the second main scale image 134 may be varied so as to match the line width of the first main scale image 132.

At step 40, the comparison unit 400 checks for portions in the first main scale image 132 where the first and second main scale images 132 and 134 have equal or similar line width. At this time, there may be situations where the distorted line width of the first main scale image 132 does not match with the line width of the second main scale image 134, or is not even similar to the line width of the second main scale image 134 up to a predetermined level. Under these circumstances, at step 50, the comparison unit 400 may output an interlock control signal to the exposure apparatus. This interlock signal may prevent any future exposure processes in the exposure apparatus. In contrast, when the line widths of the first and second main scale images 132 and 134 match each other, or are similar up to a predetermined level, then at step 50, the comparison unit 400 selectively extracts the portion of the first main scale image 132 whose line width matches with that of the second main scale image 134. This selectively extracted part of the first main scale image 132 may be called the third main scale image 136. It should be noted that the vernier image 142 is obtained from among from the plurality of overlay pattern images together with the first main scale image 132.

At step 70, the restoration unit 500 restores the extracted image of the first main scale 130 so that the extracted image corresponds to the main scale pattern formed at the reticles of the exposure apparatus. The first main scale image 132 restored at the restoration unit 500 may be called the fourth main scale image 138. Alternatively, the first main scale image 132 restored at the restoration unit 500 may be matched with the second main scale image 134. Therefore, the restoration unit 500 can fix the second main scale image 134 at the position of the first main scale image 132 without extracting the third main scale image 136 at the comparison unit 400, and restore the first main scale image 132 to obtain the fourth main scale image 138.

At step 80, the readout unit 600 compares the central position of the first main scale image 132 with that of the vernier image 142 to calculate the correction value for the overlay patterns. As mentioned above, the readout unit 600 divides the first main scale image 132 restored at the restoration unit 500 into the X and Y axial directions, and then calculates a central position between the plurality of bars perpendicular to the X axial direction and a central position between the plurality of bars perpendicular to the Y axial direction, thereby finding the central position of the first main scale image 132. Furthermore, the readout unit 600 divides both sides of the square vernier 140 which are at right angles to each other into the X and Y axial directions and finds the central position of the vernier 140. Ideally, the central position of the first main scale image 132 should match with the central position of the vernier 140. However, the central positions of the main scale 130 and vernier 140 may differ from each other because of an alignment error of the wafer 100 or due to conditions created by the photolithographic process. Therefore, the readout unit 600 compares the central position of the first main scale image 132 with the central position of the vernier 140, thereby calculating the correction value for the overlay patterns.

In addition, the correction value may be calculated by determining positional differences between the numerous main scales 130 formed on the wafer 100 and the numerous verniers 140 formed neighboring the main scales 130, and averaging out the various positional differences Finally, the readout unit 600 outputs the overlay pattern correction value to the exposure apparatus. The exposure apparatus may use the correction value to form the photo-resist pattern accurately during subsequent photolithographic processes.

The disclosed overlay pattern inspection system may be used in any system to compare overlay patterns. By accounting for the distortion of line widths in images of overlay patterns by restoring the distorted images with the help of images stored in a database, the disclosed system may allow for an accurate comparison between actual and desired overlay patterns. This may lead to an accurate calculation of the overlay pattern correction value, which may lead to an increase in the production yield of a manufacturing process.

In addition, by accounting for overlay patterns that are damaged or asymmetrical, the disclosed system may also allow for the accurate calculation of the overlay pattern correction value which may lead to an increase in the production yield of a manufacturing process.

The description of the exemplary embodiments is merely illustrative for a more comprehensive understanding of the present invention with reference to the drawings. Thus, it should not be construed as limitations on the scope of the present invention. It is apparent to those skilled in the art that various modifications, additions and substitutions are possible, without departing from the scope and spirit of the invention as disclosed in the accompanying claims.

What is claimed is:

1. An apparatus for inspecting overlay patterns, comprising:
    an optical module which projects a plurality of neighboring overlay patterns formed on a wafer;
    a pickup unit which obtains a plurality of image signals corresponding to the plurality of overlay patterns projected from the optical module;
    a comparison unit including a database which provides at least one pre-stored overlay pattern image, the comparison unit configured to:
        generate a plurality of images including the plurality of overlay patterns from the image signals obtained at the pickup unit;
        compare an overlay pattern image corresponding to any one of the plurality of overlay patterns with the pre-stored overlay pattern image; and
        based on the comparison, extract at least a portion of the overlay pattern image identical or similar to the previously input overlay pattern image;

a restoration unit which restores the extracted overlay pattern image in accordance with a predetermined overlay pattern; and a readout unit which calculates and compares a position of the restored overlay pattern image with a position of an overlay pattern image not compared by the comparison unit, and which reads out a deviation between the two positions.

2. The apparatus according to claim 1, further comprising a display unit which displays at least one of an overlay pattern image picked up by the pickup unit, an overlay pattern image compared and extracted by the comparison unit, an overlay pattern image restored by the restoration unit, and the overlay pattern image not compared by the comparison unit.

3. The apparatus according to claim 1, wherein the optical module includes:
   a light source which generates incident light including white visible light incident onto a surface of the wafer;
   a light guide unit which propagates the incident light generated by the light source in a direction perpendicular to the surface of the wafer, the wafer being supported by a chuck on a stage; and
   a projection unit which casts the incident light propagated by the light guide unit onto the surface of the wafer, extracts light reflected from the surface of the wafer, and projects the reflected light onto the pickup unit.

4. The apparatus according to claim 1, wherein the pickup unit includes a charge coupled device or a complementary metal oxide semiconductor.

5. The apparatus according to claim 1, wherein the overlay pattern image compared with the pre-stored overlay pattern image by the comparison unit and restored by the restoration unit is a main scale pattern image, and the overlay pattern image not compared by the comparison unit is a vernier pattern image.

6. The apparatus according to claim 1, wherein the restoration unit restores the overlay pattern image extracted by the comparison unit in accordance with an overlay pattern formed on a reticle of an exposure apparatus.

7. The apparatus according to claim 1, wherein the restoration unit performs restoration by placing the pre-stored overlay pattern image over the overlay pattern image corresponding to any one of the plurality of overlay patterns picked up by the pickup unit.

8. An apparatus for inspecting overlay patterns, comprising:
   an optical module which projects a plurality of neighboring overlay patterns formed on a wafer;
   a pickup unit which obtains a plurality of image signals corresponding to the plurality of overlay patterns projected from the optical module;
   a comparison unit configured to:
      generate a plurality of images including the plurality of overlay patterns from the image signals obtained at the pickup unit;
      compare an overlay pattern image corresponding to any one of the plurality of overlay patterns with a previously input overlay pattern image; and
      based on the comparison, extract at least a portion of the overlay pattern image identical or similar to the previously input overlay pattern image;
   a restoration unit which restores the extracted overlay pattern image in accordance with a predetermined overlay pattern; and
   a readout unit which calculates and compares a position of the restored overlay pattern image with a position of an overlay pattern image not compared by the comparison unit, and which reads out a deviation between the two positions,
   wherein the comparison unit includes a database which provides at least one pre-stored overlay pattern image, and
   wherein the comparison unit compares a line width of the pre-stored overlay pattern image with a line width of the overlay pattern image corresponding to any one of the plurality of overlay patterns picked up by the pickup unit, and extracts at least a portion of the overlay pattern image from any one of the plurality of overlay patterns where the line widths of the overlay pattern images are equal or similar to each other.

9. The apparatus according to claim 8, wherein the comparison unit performs the comparison by overlapping the overlay pattern images or by comparing corresponding portions of the overlay pattern images by placing the overlay pattern images separate from each other.

10. An apparatus for inspecting overlay patterns, comprising:
   an optical module which projects a plurality of neighboring overlay patterns formed on a wafer;
   a pickup unit which obtains a plurality of image signals corresponding to the plurality of overlay patterns projected from the optical module;
   a comparison unit configured to:
      generate a plurality of images including the plurality of overlay patterns from the image signals obtained at the pickup unit;
      compare an overlay pattern image corresponding to any one of the plurality of overlay patterns with a previously input overlay pattern image; and
      based on the comparison, extract at least a portion of the overlay pattern image identical or similar to the previously input overlay pattern image;
   a restoration unit which restores the extracted overlay pattern image in accordance with a predetermined overlay pattern; and
   a readout unit which calculates and compares a position of the restored overlay pattern image with a position of an overlay pattern image not compared by the comparison unit, and which reads out a deviation between the two positions,
   wherein the comparison unit includes a database which provides at least one pre-stored overlay pattern images and
   wherein the comparison unit extracts one of the remaining overlay pattern images not compared with the overlay pattern image provided from the database, among the plurality of overlay patterns picked up by the pickup unit.

11. An apparatus for inspecting overlay patterns, comprising:
   an optical module which projects a plurality of neighboring overlay patterns formed on a wafer;
   a pickup unit which obtains a plurality of image signals corresponding to the plurality of overlay patterns projected from the optical module;
   a comparison unit configured to:
      generate a plurality of images including the plurality of overlay patterns from the image signals obtained at the pickup unit;
      compare an overlay pattern image corresponding to any one of the plurality of overlay patterns with a previously input overlay pattern image; and based on the comparison, extract at least a portion of the overlay pattern image identical or similar to the previously input overlay pattern image;

a restoration unit which restores the extracted overlay pattern image in accordance with a predetermined overlay pattern; and a readout unit which calculates and compares a position of the restored overlay pattern image with a position of an overlay pattern image not compared by the comparison unit, and which reads out a deviation between the two positions, wherein the readout unit:

divides the overlay pattern image restored by the restoration unit into X and Y axial directions;

finds a central position of the divided overlay pattern image restored by the restoration unit;

divides the overlay pattern image not compared by the comparison unit into X and Y axial directions;

finds a central position of the divided overlay pattern image not compared by the comparison unit;

compares the central position of the divided overlay pattern image restored by the restoration unit with the central position of the divided overlay pattern image not compared by the comparison unit; and calculates a correction value for the overlay patterns based on the comparison.

12. A method for inspecting overlay patterns, comprising the steps of:

projecting a plurality of neighboring overlay patterns formed on a wafer;

picking up the plurality of projected overlay patterns and obtaining image signals corresponding to the plurality of projected overlay patterns;

generating images including the plurality of overlay patterns using the obtained image signals;

comparing an overlay pattern image corresponding to any one of the plurality of overlay patterns with an overlay pattern image pre-stored at a database;

extracting, based on the comparison, at least a portion of the overlay pattern image identical or similar to the previously input overlay pattern image;

restoring the extracted overlay pattern image in accordance with a predetermined overlay pattern;

calculating and comparing a position of the restored overlay pattern image with a position of an overlay pattern image not compared by the comparison unit; and reading out a deviation between the two positions.

13. The method according to claim 12, further comprising a step of outputting an interlock control signal to an exposure apparatus when the overlay pattern images compared are not identical or similar to a predetermined level, the interlock signal preventing any subsequent exposure process in an exposure apparatus.

* * * * *